United States Patent
Lee

(10) Patent No.: US 7,338,855 B2
(45) Date of Patent: Mar. 4, 2008

(54) METHOD FOR FABRICATING SEMICONDUCTOR DEVICE

(75) Inventor: Jae Suk Lee, Suwon (KR)

(73) Assignee: Dongbu Electronics Co., Ltd., Seoul (KR)

(*) Notice: Subject to any disclaimer, the term of this patent is extended or adjusted under 35 U.S.C. 154(b) by 69 days.

(21) Appl. No.: 11/312,594

(22) Filed: Dec. 21, 2005

(65) Prior Publication Data

US 2006/0141734 A1    Jun. 29, 2006

(30) Foreign Application Priority Data

Dec. 29, 2004 (KR) ............... 10-2004-0115668

(51) Int. Cl.
*H01L 21/8242* (2006.01)

(52) U.S. Cl. .............. 438/253; 438/210; 438/239; 438/396; 438/964

(58) Field of Classification Search ........ 438/210, 438/239, 250, 253, 393, 396, FOR. 220, 438/FOR. 430, 964, FOR. 488
See application file for complete search history.

(56) References Cited

U.S. PATENT DOCUMENTS

| 5,233,310 A | * | 8/1993 | Inoue ............... 330/277 |
| 6,159,793 A | * | 12/2000 | Lou ................. 438/255 |
| 2001/0050390 A1 | * | 12/2001 | Kawai et al. ........ 257/301 |
| 2003/0161081 A1 | * | 8/2003 | Girardie ............. 361/15 |
| 2005/0062130 A1 | * | 3/2005 | Ciancio et al. ....... 257/532 |
| 2005/0112836 A1 | * | 5/2005 | Kim et al. .......... 438/307 |

* cited by examiner

*Primary Examiner*—George R. Fourson
*Assistant Examiner*—Joannie Adelle Garcia
(74) *Attorney, Agent, or Firm*—McKenna Long & Aldridge LLP

(57) ABSTRACT

A method for fabricating a semiconductor device is provided, wherein a large MIM capacitor including an uneven surface if formed to increase capacitance. The method includes forming a polysilicon layer on a lower metal layer by plasma-enhanced chemical vapor deposition; forming an uneven surface in the polysilicon layer by etching the polysilicon layer with an isotropic etchant; forming an upper metal layer on the polysilicon layer; sequentially etching the upper metal layer and the polysilicon layer; and performing chemical-mechanical polishing after completing a gap-fill process on the upper metal layer.

8 Claims, 2 Drawing Sheets

METHOD FOR FABRICATING SEMICONDUCTOR DEVICE

This application claims the benefit of Korean Patent Application No. 10-2004-0115668, filed on Dec. 29, 2004, which is hereby incorporated by reference for all purposes as if fully set forth herein.

BACKGROUND OF THE INVENTION

1. Field of the Invention

The present invention relates to semiconductor devices, and more particularly, to a method for fabricating a semiconductor device having a MIM capacitor including an uneven surface over a large area.

2. Discussion of the Related Art

The capacitor of a semiconductor device may have a poly-insulator-poly (PIP) or metal-insulator-metal (MIM) structure.

Along with the increasing demand for highly integrated multi-function devices, there is an increasing requirement for a high-capacitance capacitor. To increase a capacitance in the capacitor, the capacitor may be formed by using a material having a greater dielectric constant, by decreasing the thickness of an insulating layer, or by increasing a surface area of the capacitor. There are limitations, however, with respect to using a material having a greater dielectric constant and decreasing the thickness of an insulating layer.

As shown in FIG. 1, illustrating a method for forming a capacitor of a semiconductor device according to the related art, an insulator 20 of $Si_3N_4$ is formed on a lower metal layer 10 by plasma-enhanced chemical vapor deposition. Subsequently, an upper metal layer 30 of Al/Ti/TiN is deposited and patterned on the insulator 20, thereby forming a MIM structure. After forming a lower metal pattern, an insulating layer 40 is formed by a high-density plasma deposition.

In the method according to the related art, widely used methods for improving the capacitance include applying new materials and developing layer characteristics. However, the capacitor has a flat surface. Thus, increasing integration is limited. Furthermore, the improvement of capacitance in the capacitor is limited.

SUMMARY OF THE INVENTION

Accordingly, the present invention is directed to a method for fabricating a semiconductor device that substantially obviates one or more problems due to limitations and disadvantages of the related art.

An advantage of the present invention is to provide a method for fabricating a semiconductor device, wherein a MIM capacitor including an uneven surface is formed for a large surface area, to thereby increase its capacitance.

Additional features and advantages of the invention will be set forth in the description which follows, and in part will be apparent from the description, or may be learned by practice of the invention. The objectives and other advantages of the invention will be realized and attained by the method particularly pointed out in the written description and claims hereof as well as the appended drawings.

To achieve these and other advantages and in accordance with the purpose of the invention, as embodied and broadly described, there is provided a method for fabricating a semiconductor device having a capacitor of a metal-insulator-metal structure, the method comprising forming a polysilicon layer on a lower metal layer by plasma-enhanced chemical vapor deposition; forming an uneven surface in the polysilicon layer by etching the polysilicon layer with an isotropic etchant; forming an upper metal layer on the polysilicon layer; sequentially etching the upper metal layer and the polysilicon layer; and performing chemical-mechanical polishing after completing a gap-fill process on the upper metal layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principle of the invention. In the drawings.

DETAILED DESCRIPTION OF THE INVENTION

Reference will now be made in detail to the embodiments of the present invention, examples of which are illustrated in the accompanying drawings. Wherever possible, like reference designations will be used throughout the drawings to refer to the same or similar parts.

Figure 1:
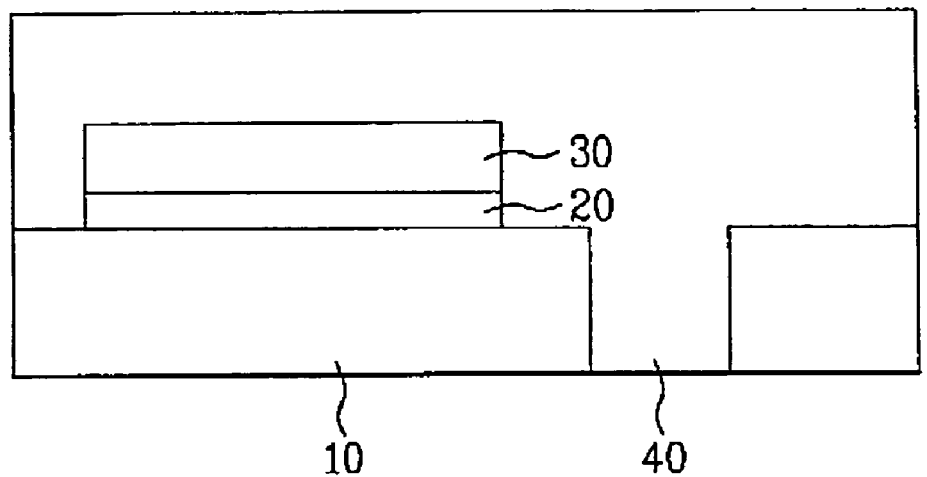
FIG. 1 is a cross-sectional view of a semiconductor device, illustrating a method for forming a capacitor according to a related art.
Figure 2A:
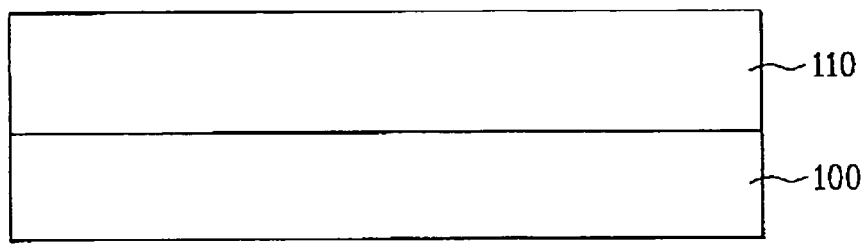
FIGS. 2A-2D are cross-sectional views of a semiconductor device, illustrating a method for forming a capacitor according to the present invention.

As shown in FIG. 2A, a polysilicon layer 110 is deposited on a lower metal layer 100 by plasma-enhanced chemical vapor deposition. The lower metal layer 100 is formed by sequentially depositing a barrier metal, an aluminum layer and a reflection-preventive layer. The barrier metal and the reflection-preventive layer may be respectively formed of Ti and TiN. The polysilicon layer 100 is formed in a poly-crystal structure, growing in a multi-grain shape of various surface structures, namely, a <100> surface, a <111> surface, and a <110> surface. The polysilicon layer 100 is formed at a temperature between 350° C. and 400° C. to reach a thickness between 100 Å and 1000 Å.

Figure 2B:
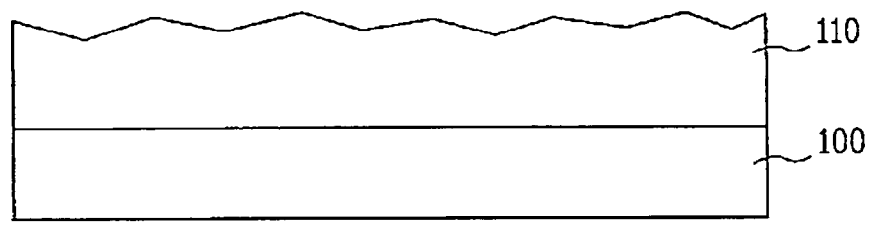

As shown in FIG. 2B, the polysilicon layer 100 is etched with an isotropic etchant and is thus imparted with an uneven surface. The uneven surface of the polysilicon layer 100 is treated with $NH_3$ or $N_2$ plasma and thus transformed into $Si_xN_yH_z$, that is, a material based on $Si_3N_4$. When forming the uneven surface in the polysilicon layer 100, KOH, NaOH, or a compound formed by adding alcohol to KOH or NaOH may be used. Formation of the uneven surface is made possible since an etching ratio for the <100> surface is greater than that for the <111> surface.

Figure 2C:
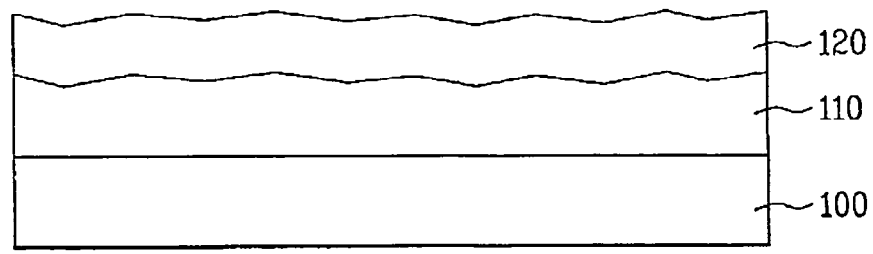

As shown in FIG. 2C, an upper metal layer 120 is formed on the polysilicon layer 110 by sequentially depositing Ti/TiN, an aluminum layer, and Ti/TiN. A photoresist pattern (not shown) is formed on the upper metal layer 120, and the upper metal layer 120 undergoes plasma etching, thereby forming a capacitor upper electrode. Subsequently, the polysilicon layer 110 is etched and the photoresist pattern is removed.

Figure 2D:
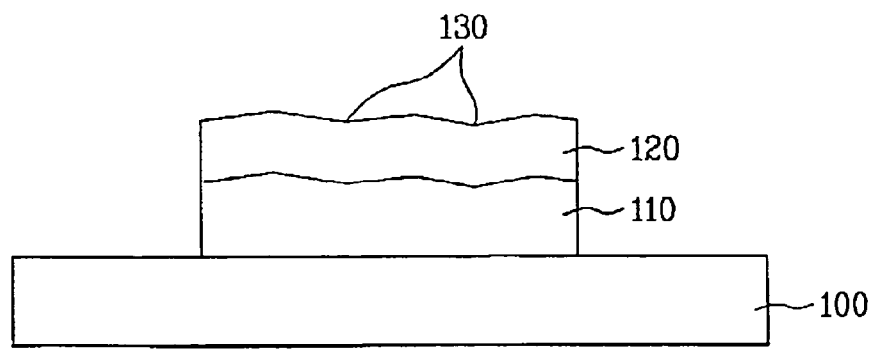

As shown in FIG. 2D, a process for gap-fill is performed with a high-density plasma oxide layer 130, and chemical-mechanical polishing is performed, thereby completing the MIM structure.

According to the present invention, a semiconductor device is provided with a MIM capacitor having an uneven surface, to thereby increase the area of opposing surfaces and thus increase its capacitance.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device having a capacitor of a metal-insulator-metal structure, comprising:
    forming a polysilicon layer on a lower metal layer by plasma-enhanced chemical vapor deposition;
    forming an uneven surface in the polysilicon layer by etching the polysilicon layer with an isotropic etchant;
    forming an upper metal layer on the polysilicon layer;
    sequentially etching the upper metal layer and the polysilicon layer; and
    performing chemical-mechanical polishing after completing a gap-fill process on the upper metal layer.

2. The method of claim 1, wherein forming the polysilicon layer is performed at a temperature between 350° C. and 400° C. and wherein the polysilicon layer has a thickness between 100 Å and 1000 Å.

3. The method of claim 1, wherein forming the lower metal layer is performed by sequentially depositing a barrier metal, an aluminum layer, and a reflection-preventive layer.

4. The method of claim 3, wherein the barrier metal is formed of Ti and the reflection-preventive layer is formed of TiN.

5. The method of claim 1, wherein the isotropic etchant is any one of KOH, NaOH, and a compound formed by adding alcohol to one of KOH and NaOH.

6. The method of claim 1, wherein, in forming an uneven surface, a surface of the polysilicon layer is transformed to $Si_xN_yH_z$, using one of $NH_3$ plasma and $N_2$ plasma.

7. The method of claim 1, wherein forming the upper metal layer is performed by sequentially depositing Ti/TiN, an aluminum layer, and Ti/TiN.

8. The method of claim 1, wherein etching the upper metal layer and the polysilicon layer is performed with a plasma etching process using a photoresist pattern.

* * * * *